United States Patent
Fairbairn et al.

(10) Patent No.: US 6,919,001 B2
(45) Date of Patent: Jul. 19, 2005

(54) DISK COATING SYSTEM

(75) Inventors: Kevin P. Fairbairn, Santa Clara County, CA (US); Terry Bluck, Santa Clara County, CA (US); Craig Marion, Alameda County, CA (US); Robert E. Weiss, San Francisco County, CA (US)

(73) Assignee: Intevac, Inc., Santa Clara, CA (US)

( * ) Notice: Subject to any disclaimer, the term of this patent is extended or adjusted under 35 U.S.C. 154(b) by 95 days.

(21) Appl. No.: 10/361,308

(22) Filed: Feb. 10, 2003

(65) Prior Publication Data
US 2003/0159919 A1 Aug. 28, 2003

Related U.S. Application Data

(63) Continuation-in-part of application No. 09/562,039, filed on May 1, 2000, now Pat. No. 6,517,691.

(51) Int. Cl.[7] .......................... C23C 14/32; B65G 65/00
(52) U.S. Cl. ............................. 204/298.25; 204/192.2; 156/345.31; 156/345.32; 118/719; 414/217; 414/225.01; 414/226.02
(58) Field of Search ........................ 204/298.25, 192.2; 156/345.31, 345.32; 118/719; 414/225.01, 226.02, 226.01, 217

(56) References Cited

U.S. PATENT DOCUMENTS

| | | | |
|---|---|---|---|
| 4,981,408 A | | 1/1991 | Hughes et al. |
| 5,215,420 A | | 6/1993 | Hughes et al. |
| 5,275,709 A | | 1/1994 | Anderle et al. |
| 5,425,611 A | | 6/1995 | Hughes et al. |
| 5,543,022 A | * | 8/1996 | Nguyen et al. ........ 204/298.15 |
| 5,658,114 A | | 8/1997 | Mahler |
| 5,705,044 A | * | 1/1998 | Washburn et al. ..... 204/298.25 |
| 5,788,447 A | | 8/1998 | Yonemitsu et al. |
| 5,928,390 A | | 7/1999 | Yaegashi et al. |
| 6,027,618 A | | 2/2000 | Aruga et al. |
| 6,101,972 A | | 8/2000 | Bluck et al. |
| 6,176,667 B1 | | 1/2001 | Fairbairn et al. |
| 6,183,831 B1 | | 2/2001 | Hughes et al. |
| 6,203,862 B1 | | 3/2001 | Bluck et al. |
| 6,228,439 B1 | | 5/2001 | Watanabe et al. |
| 6,251,232 B1 | | 6/2001 | Aruga et al. |
| 6,287,067 B1 | | 9/2001 | Miyamoto et al. |
| 6,368,678 B1 | | 4/2002 | Bluck et al. |
| 6,503,365 B1 | | 1/2003 | Kim et al. |
| 2002/0168251 A1 | | 11/2002 | Choi et al. |

FOREIGN PATENT DOCUMENTS

WO    WO 0011667    *    3/2000

* cited by examiner

Primary Examiner—Rodney G. McDonald
(74) Attorney, Agent, or Firm—Stanley Z. Cole

(57) ABSTRACT

There is described a disk processing and manufacturing equipment in which the processing chambers are stacked on top of each other and in which the disks move through the system on disk carriers which are adjustable to take disks of varying sizes. The disks enter the system through a load zone and are then installed into disk carriers. They move in the carriers sequentially through processing chambers at one level and then move to the other level in a lift or elevator. At this other level, the disks again move sequentially through the system on that level and then exit at an unload zone.

28 Claims, 14 Drawing Sheets

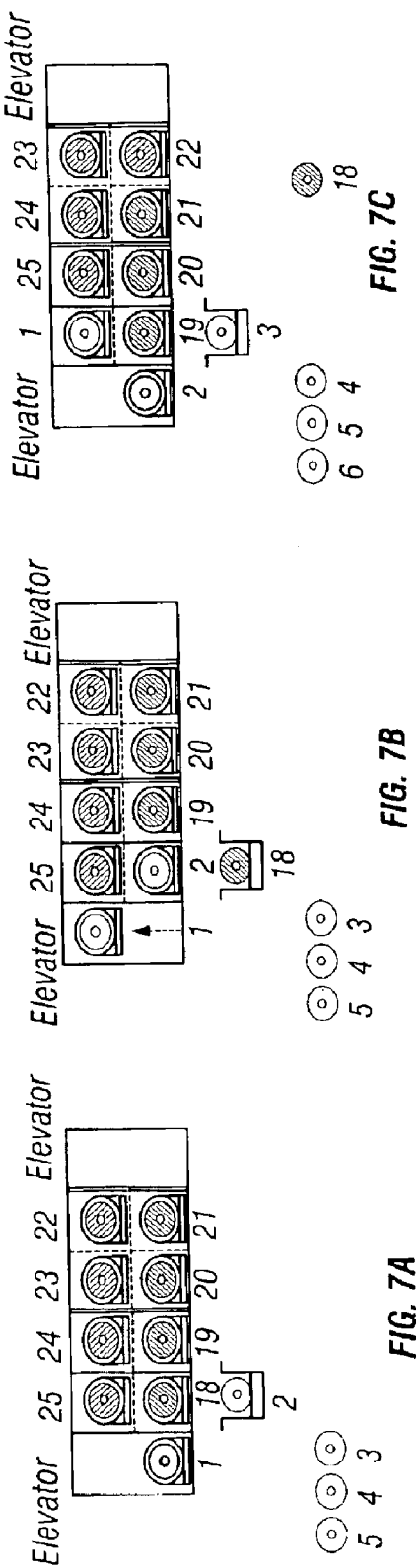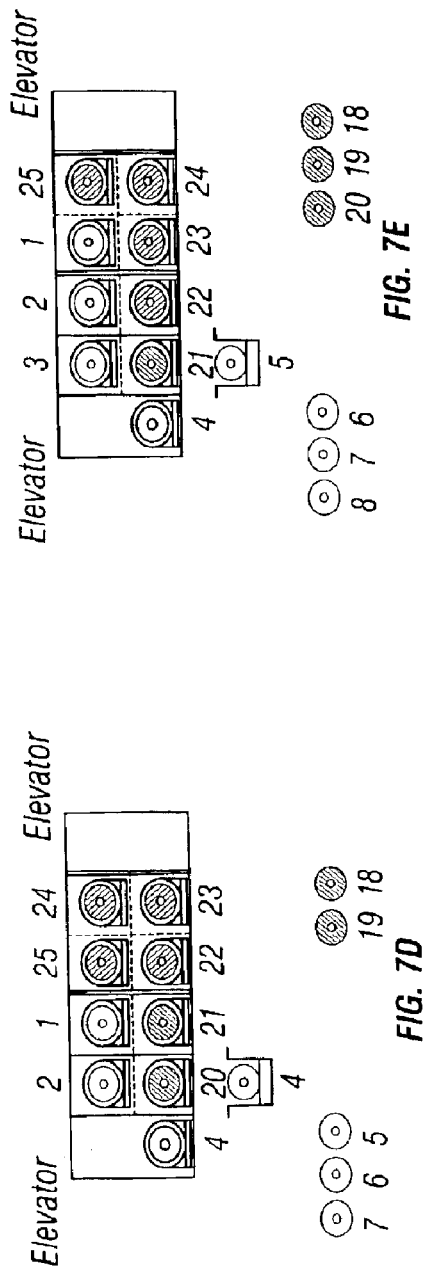
FIG. 7A  FIG. 7B  FIG. 7C  FIG. 7D  FIG. 7E

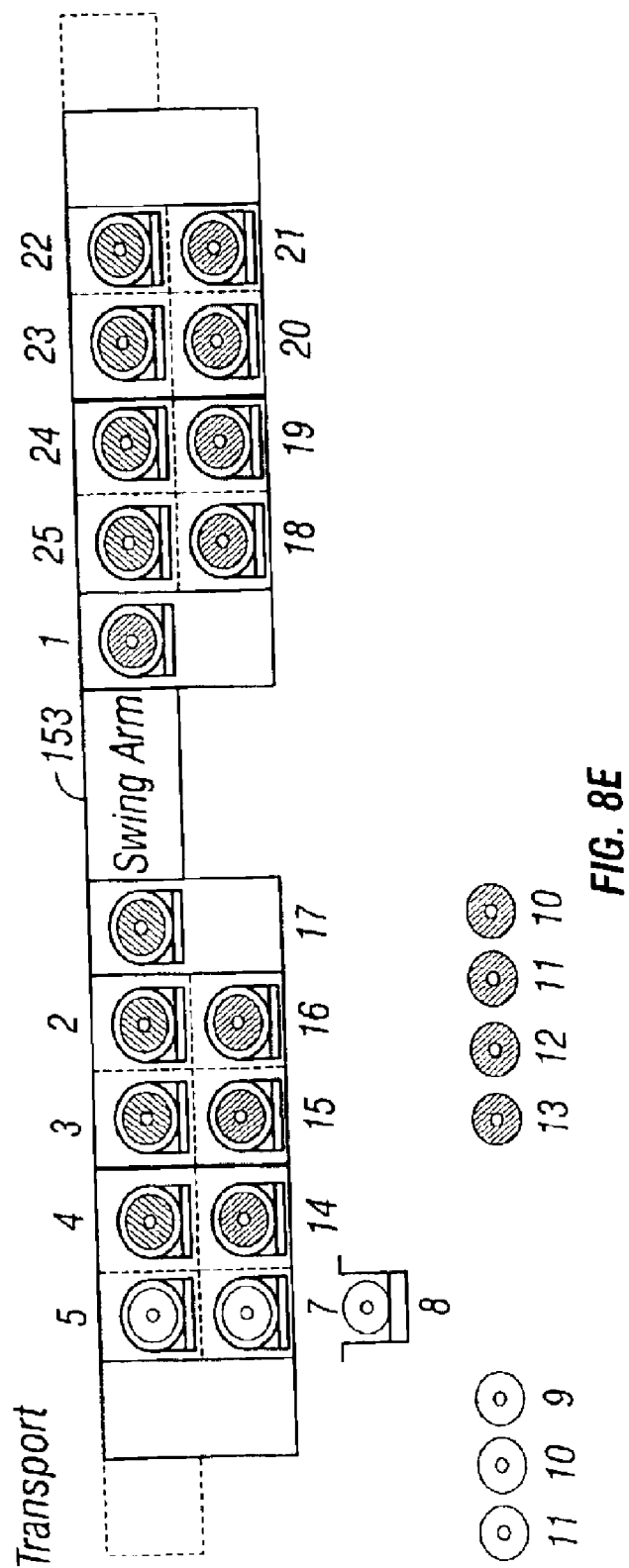

DISK COATING SYSTEM

CROSS REFERENCE TO RELATED APPLICATION

This invention is a continuation in part of a application filed May 1, 2000, Ser. No. 09/562,039 now U.S. Pat. No. 6,517,691, entitled Substrate Processing System.

FIELD OF THE INVENTION

This invention relates to a system and processes for handling and processing thin substrates such as substrates used in making magnetic disks. More particularly, the invention relates to an improved system for processing substrates, including simultaneously on both sides, in several processing stations and using various coating techniques.

BACKGROUND OF THE INVENTION

As was described by a disk manufacturer in the N.Y. Times, Jul. 1, 2002, "The plastic tray they sell you to carry your drive home is a higher gross margin product " than the modern computer hard disk. Yet we demand that the disk include as much technology in today's world as a complex computer chip. This invention is directed to improving manufacture of such disks to permit the creation of higher technology on the disks and to help bring cost down.

U.S. Pat. Nos. 5,215,420 and 5,425,611 describe equipment that is primarily used to manufacture disks today. This equipment is available from Intevac, Inc. of Santa Clara, Calif. and is marketed as the MPD 250. The equipment includes a main chamber, entrance and output load locks, substrate load and unload stages and a plurality of processing stations. Disks are fed into the system transported and treated in processing stations and then are fed from the system as disks ready for use as hard disks in computer applications. Prior to the development of the MPD 250, there existed equipment in this field as described in U.S. Pat. No. 4,981,408 which equipment was at one time available from Varian Associates of Palo Alto, Calif. Another manufacturer in this field is Anelva Corporation of Fuchu, Japan. Anelva manufactures a unit designated the C-3040. One of its objectives is to deposit films of greater thickness on the substrate. Patents describing this system are U.S. Pat. Nos. 6,027,618, 6,228,439 B1 and 6,251,232 B1. These background patents are all incorporated into this disclosure by reference.

One fault with these prior art systems is that they occupy a rather large footprint. Some are excessively long. Others cover a generally rectangular area and this generally is an entire room. Since these units for the manufacture of disks are typically operated in clean rooms oversized units compel excessively sized and extremely expensive clean rooms.

Recently it has also become recognized that as the art has progressed it has become necessary to supplement the original systems with add-ons. For example, one such add-on is a lube station to lubricate disks before they are removed from the tool. This is described in U.S. Pat. No. 6,183,831 B1 and in the parent application Ser. No. 09/562, 039, filed May 1, 2000. Another has to do with the deposition of carbon to create diamond like coatings using plasma enhanced CVD. This is described for example in U.S. Pat. Nos. 6,101,972, 6,203,862 and 6,368,678 B1.

In radial systems there is a limit as to how many processing stations can function as part of the unit. Typically, existing systems are limited to about 12 stations. Adding additional stations requires considerable redesign of the equipment and the factory facilities with the expectation that a system with more stations would increase its footprint considerably. In these systems the same substrate holder is generally used to carry the substrate to and through the various stations of the unit. If it becomes necessary or desirable to change the substrate holder this would require stopping operation of the system and its production of output. Also it has not been possible to do processing in these systems while the substrate is moving and this prevents the deposition of very thin layers which can be deposited when deposition is carried out in a pass by mode.

A linear machine has the same type of problems experienced with a radial system. It has a large footprint and to change the substrate holder, requires that the system and production be stopped. Any add-on, if possible, extends the footprint and eventually the number of stations would be controlled by space constraints of the facility.

SUMMARY OF THE INVENTION

The preferred embodiment of the present invention is a system that processes substrates in a vertical position on both sides simultaneously with high throughput in a structure with a comparatively small footprint. The system has flexibility and permits the addition of process stations. The system can be segmented so that substrate carriers can be limited to certain process stations and then changed so that clean carriers are used in other stations. This has not been a capability of prior art units and this characteristic allows coating substrates using processes which would normally deposit onto the carrier and then contaminate subsequent processing stations. The system can be a stand alone type system or may be connected to another system to extend the capabilities of the other system. The system architecture enable both static processing in which the substrate is stationary during processing and pass by processing in which the substrate moves during processing. The architecture of this invention also permits adding additional stations without substantially changing the footprint as to enable additional processes to be performed on a substrate as technology requirements change to enable increasing the throughput of the unit. Another modification permits replacing the substrate holder with one that holds more than one substrate in each of the process stations as to double or increase even more the output, again without impacting the footprint of the unit. These and other benefits and improvements will be discussed in the descriptions that follow.

BRIEF DESCRIPTION OF THE DRAWINGS

For a better understanding of the present invention, reference is made to the accompanying drawings, which are incorporated herein by reference and in which:

FIGS. 7A, B, C, D and E are illustrative transport diagrams showing a programmed path that substrates and associated disk carriers travel;

DETAILED DESCRIPTION

Figure 1:
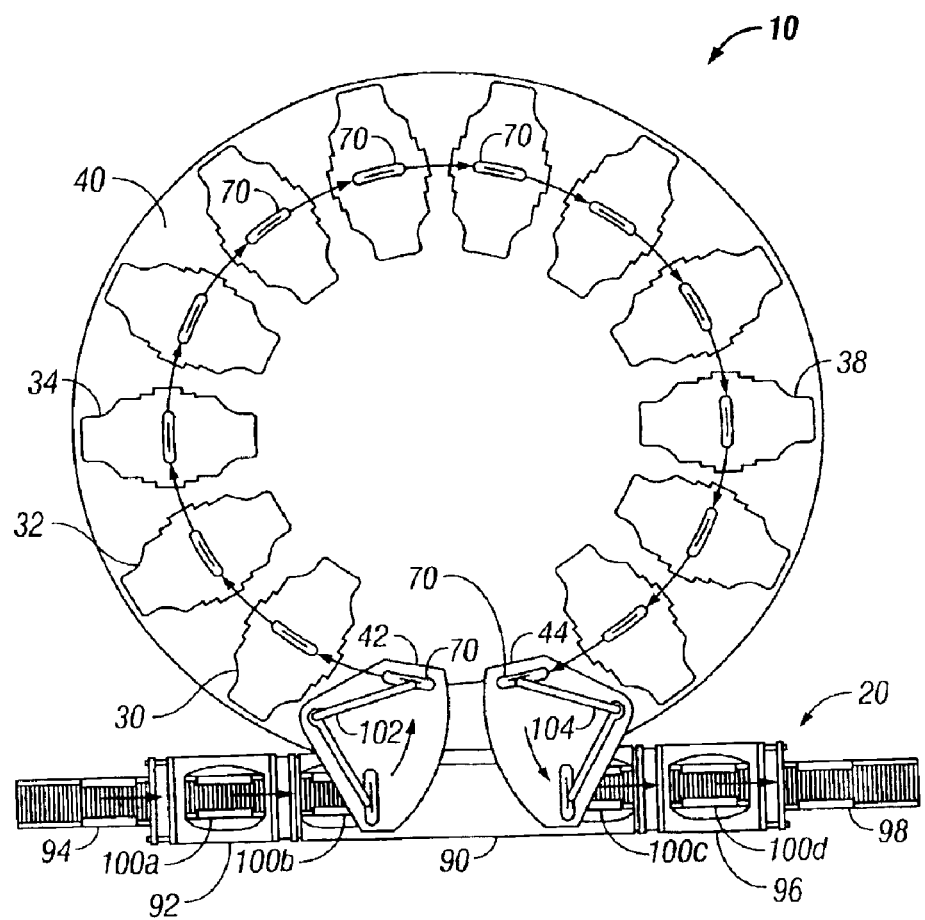
FIG. 1 is a top view of a prior art substrate processing system.

A prior art substrate processing system is shown in FIG. 1 where like elements have the same reference numerals. As shown in FIG. 1, the system includes a processing unit 10 and a substrate handling system 20. The processing unit 10 includes a plurality of process stations 30, 32, 34, etc. mounted on a main vacuum chamber 40. Process stations 30, 32, 34, etc. are mounted in a circular arrangement with respect to a circular central main vacuum chamber 40. Processing unit 10 further includes a loading station 42 for loading substrates into the system for processing and an unloading station 44 for unloading substrates from the system following processing. The substrates are typically substrates for making magnetic hard disks or for making magnetic optical disks. The substrates and ultimate disks include a central opening. The substrate processing system may further include vacuum pumps, power supplies and a controller (not shown).

Processing is carried out in the different process stations 30, 32, 34, etc., which may be the same or different, depending on the requirements of the system. In the example of FIG. 1, the system has twelve process stations, loading station 42 and unloading station 44, which are equiangularly spaced. The process stations may comprise a one or more heating stations, sputter stations, cooling stations, chemical vapor deposition stations and the like, as are employed in the art in manufacturing magnetic disks. The substrates are moved through the system as to serially transfer to and be processed by the process stations, one after another and for the same amount of time at each station. The substrate holder also seals the process station from the main vacuum chamber during processing operations as to avoid contamination within the process stations and the central chamber.

Within main vacuum chamber 40 there are positioned a plurality of substrate grippers, or disk grippers, positioned in respect to each process station such that they may be raised into the respective process stations. The substrate handling system 20 includes a buffer vacuum chamber 90, a load lock 92, an entrance conveyor 94, an unload lock 96 and an exit conveyor 98. Cassettes 100a, 100b, 100c and 100d carrying substrates for processing enter buffer vacuum chamber 90 through load lock 92 and exit from buffer vacuum chamber 90 through unload lock 96. A load arm 102, in this configuration, transfers substrates from cassette 100b to disk gripper or lifter 70 in loading station 42. An unload arm 104 transfers substrates from disk gripper or disk lifter 70 in unloading station 44 to cassette 100c. Substrate handling system 20 is described in detail in the aforementioned U.S. Pat. No. 5,215,420, which is hereby incorporated by reference.

Figure 2:
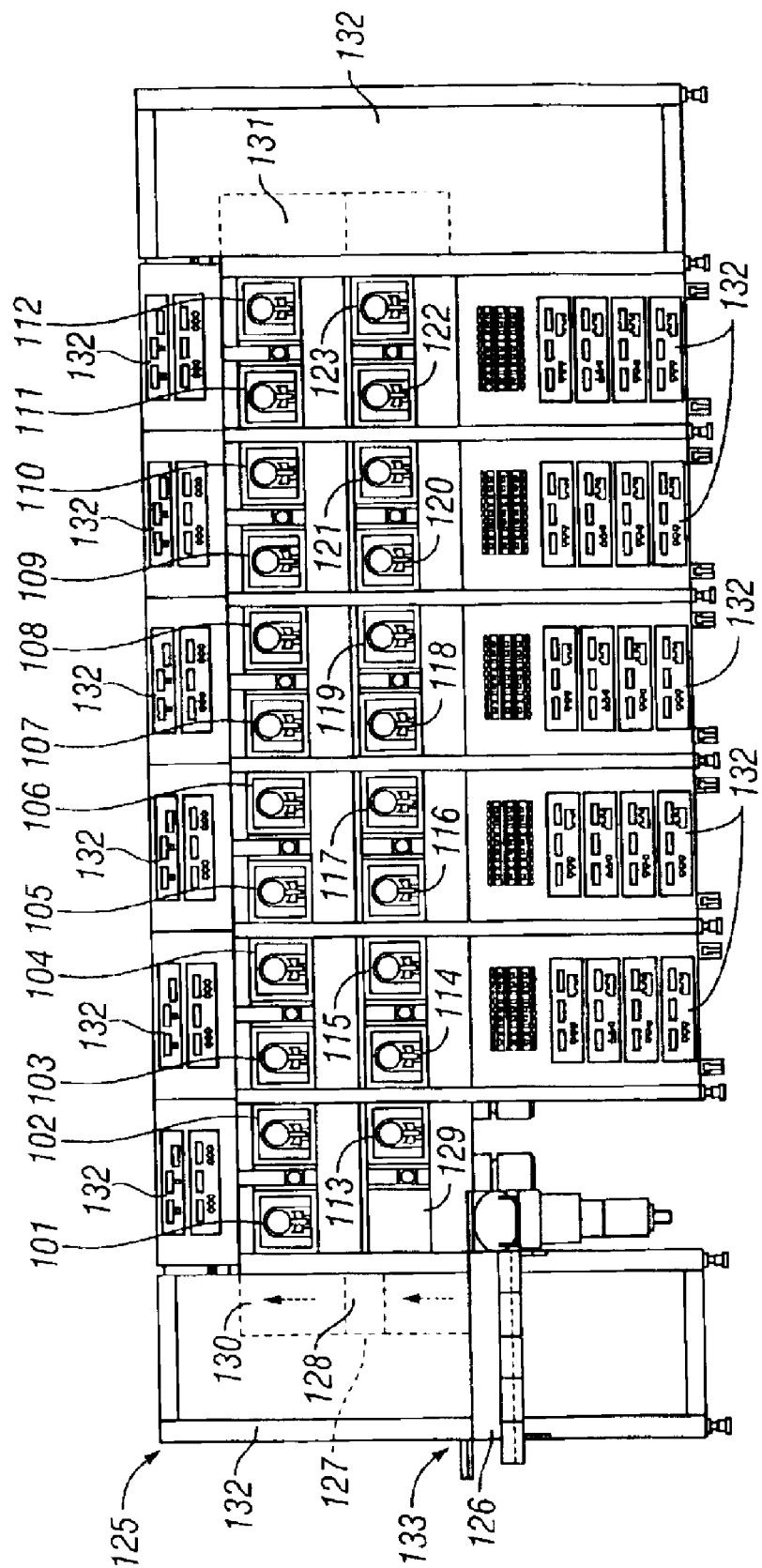
FIG. 2 is a schematic view of an illustrative 23 station system in accordance with this invention.

In FIG. 2, there is shown a preferred embodiment of a system in accordance with this invention. This comprises a number of process stations in a stacked relationship, with a second layer of process stations positioned on top of a base layer of process stations. It is a system without the large central vacuum main chamber that is found in the prior art system illustrated in FIG. 1. It permits controlled cycling for substrates being processed travelling through the system. It considerably reduces the footprint occupied by systems in the prior art and enables more process stations. It therefore permits a greater number of process operations on substrates passing through the system or in a much smaller footprint the same number of operations as may have been performed in a prior art unit with a significantly larger footprint. Further, each process station is separately pumped by an attached vacuum pump such as a turbo-molecular or cryo-pump as to create an independent atmosphere for processes performed at each station as will be illustrated and discussed in connection with subsequent figures.

Referring now to FIG. 2, a 23 station processing system is illustrated. In fact the number of stations could be more or less than this number. The stations are identified as 101–123. To load the system identified as 125, a cassette of substrates is fed into the load/unload aperture 126. The cassette travels along a path into position at load/unload station 129. A disk carrier (see FIG. 4A) moves into the load/unload chamber 129 where a transfer mechanism, on the unload side, grips a disk in the disk carrier that had been through the processing cycle, by its inner hole. The jaws of the disk carrier are then opened and the processed substrate is removed from the disk carrier and transferred to a lift blade similar to the one described as prior art in connection with FIG. 1. The lift blade then places the substrate or disk into a cassette. In this same load/unload station 129 but from the load side, a lift blade, again like the one used in the prior art, lifts a substrate or disk from the cassette and raises it into the load chamber. A transfer mechanism transfers the disk from the lift blade and transfers it to the disk carrier where jaws 134 and 139 close to grip the disk in the disk carrier (see FIG. 4A). The disk carrier then moves to an elevator 128 and is lifted (as illustrated) to a level adjacent to the upper set of process stations and directly adjacent to station 101. The substrate and carrier then move as a unit and transfer into station 101 where processing of the disk is started. Thereafter, the combined unit of a substrate 130 and a disk carrier, move into the adjacent processing station 102. After processing at station 102, the substrate and disk carrier move on to the adjacent station 103 where the disk is carried through additional processing operations. The substrate on the disk carrier travel from one processing chamber to the next along the upper level in series from 101 to 112 where the combined unit enters elevator 131. The combined unit is then lowered to the lower lever along which it travels from station 123 back to station 113. Along the way the disk is processed in accordance with the needs and desires of the manufacturing facility. For example, since substrates entering the system are in a sense water logged when considering the process to which the disk will be exposed, the elevator chamber may include a cold trap, such as a water pump or a Meisner trap to remove moisture from the disk and the vacuum system. At the first station 101, the disk may be heated to continue its preconditioning prior to being carried through coating processing.

Power controls 132 are positioned as shown above and below the processing stations. They may however, be located at the ends of the system. In the instance where the system requires a large number of controls for power intensive processes, the controls may be positioned in separate cabinets. The system is programmed and driven by entries at an operator station 133 at the left side of system 125 as shown in FIG. 2 but shown more clearly in FIG. 6A. Although station 127 is described as a load/unload station, it may in fact act only to load substrates into the system with the unload operation performed at the other end, for example, adjacent to station 123. An unload station would be found on the backside of the unit shown in FIG. 2 in a position opposite the load station on the facing side. This will be shown more clearly in a subsequent figure. In essence it looks like the load station but functions to unload the system. A disk carrier with a disk or substrate in place moves into the unload chamber. A transfer mechanism takes the disk from jaws 134 and 139 (see FIG. 4) which open and release the disk to the transfer mechanism. The transfer mechanism may be a system as is used on the structure of FIG. 1 or as subsequently discussed. This mechanism transfers the disk to the unload blade (which may conform to the load blade as used at the load station and also to the load blade used in connection with FIG. 1), where the disk is lowered into the load side of a cassette.

FIG. 2 illustrates a system 125 with 23 stations. However, if the manufacturer of a particular magnetic disk requires less processes be performed during the production of the finished disk, a full system of 23 or more stations may not be required or the substrates, in such a case, can be directed and controlled to move only through a limited group of active process stations or less than all the process stations can be operational. Alternatively, a smaller system can be used. Such a system could for example include less process stations. It is also possible to marry a stacked system with systems that rely on a central vacuum chamber and have a circular configuration. A benefit to such a structure is that it enables the existing manufacturers to tie their existing units to the system of this invention as to enable additional or new processes to be performed in making magnetic disks in a limited additional area or footprint. This will be further discussed in connection with FIG. 6 below.

Figure 4A:
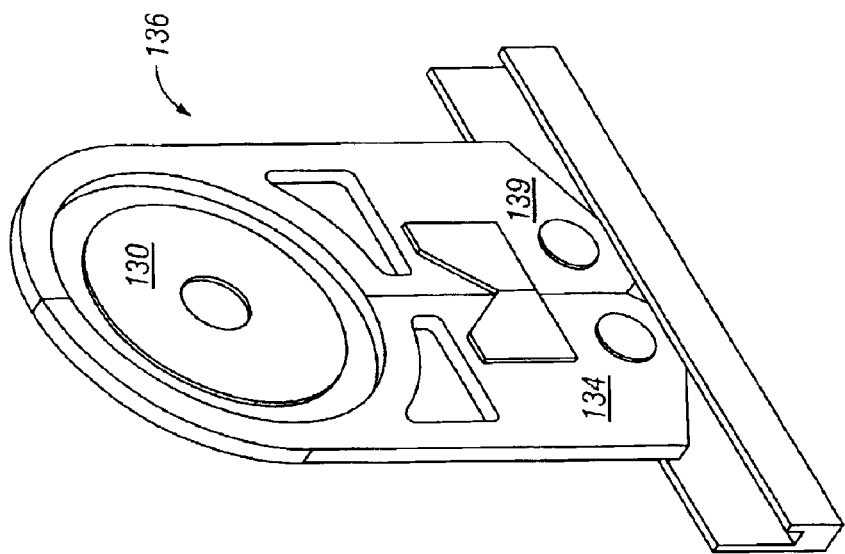
FIG. 4A is a schematic view of a disk carrier that may be used to transfer disks along the different process modules of this invention.
Figure 3:
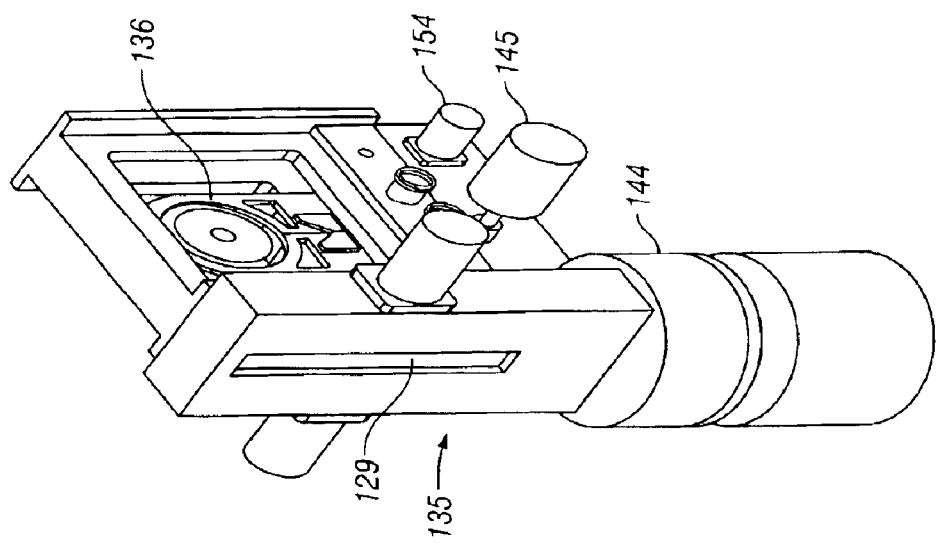
FIG. 3 is a schematic view of a single process module for use in this invention.
Figure 4C:
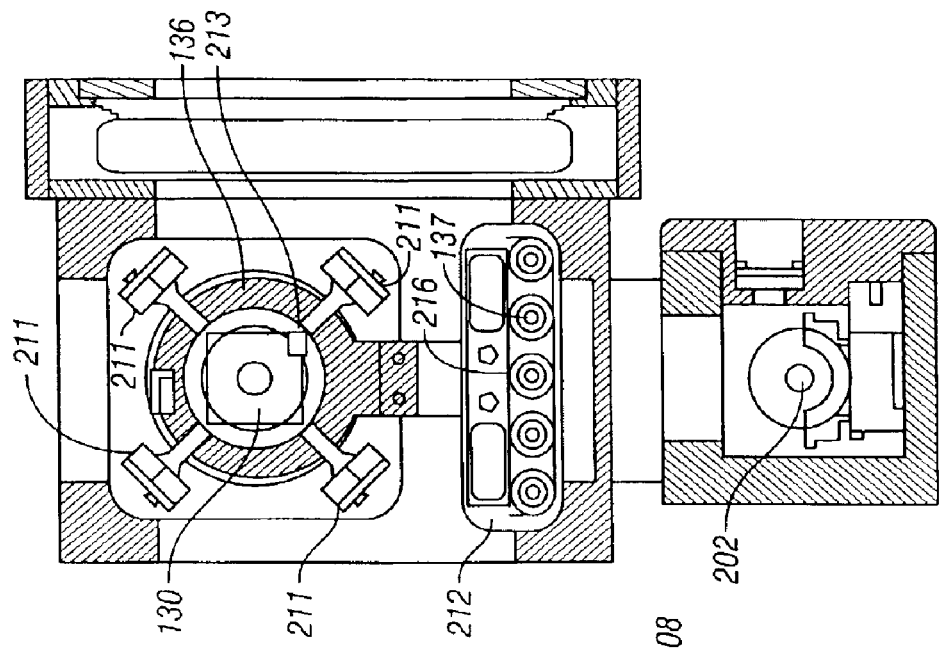
FIG. 4C is a side view of the disk transfer mechanism.
Figure 4B:
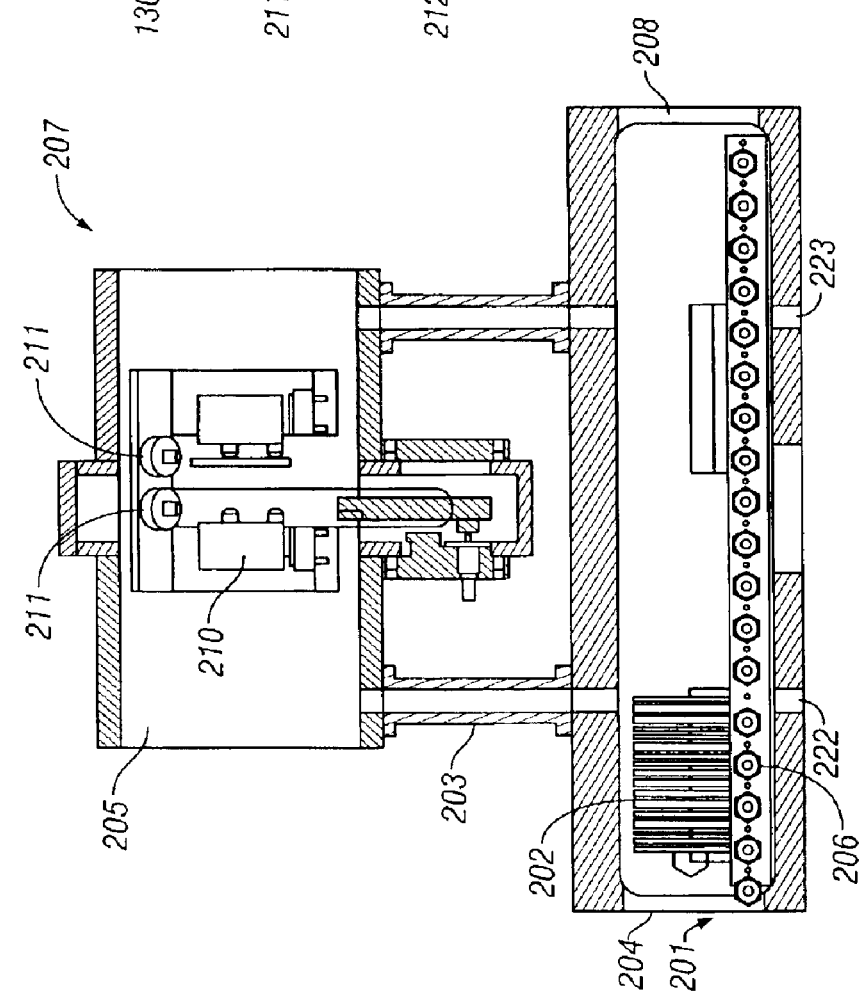
FIG. 4B shows a front view of the disk transfer mechanism.

In FIG. 3 is shown a single process module 135 and in FIG. 4A, a disk carrier 136 is illustrated with a substrate 130 in place. In FIG. 4B there is shown the mechanism to transfer disks into the carrier at the load station and to transfer disks out of the disk carrier at the unload station. In FIG. 4C there is shown another view of the mechanism in FIG. 4B with more detail in connection with the disk carrier and the arrangement of the disk on the carrier.

Disk carrier 136, is shown in position in FIG. 3 in process module 135. Isolation valve 144 and isolation valve driver 145 operate to close and open opening 129 of the chamber 135. The substrate 130 is positioned into the disk carrier and held in place in the disk carrier throughout its travels. It is released following processing in the various processing chambers by a transfer mechanism that grips the disk by its inner hole and a gripper actuator and a gripper actuator mechanism that opens the carrier jaws after the disk is gripped for unloading or before the disk is ungripped for loading. These manipulations are illustrated in FIGS. 4B and 4C.

In FIG. 4B a cassette 202 of substrates has been fed into transfer section 201 through the load door 204. At this point the substrates are in the vacuum environment. The substrates will remain in a vacuum environment for all manipulations from this point on until the processed substrates leave the transfer station 201 by being unloaded at the unload zone 207 back into a cassette and removed from the transfer station and the equipment in a cassette holder through the unload door 208. A cassette of disks 202 is shown in position at the load section of this subsystem. The cassette holder rides on wheels 206 that transport the cassette holder into position to place substrates into position to be lifted out of cassette holder 202, upwardly through transfer zone 203 and to disk loading zone 205 where the substrates are loaded into the disk carrier. As has been described the disk is lifted out of the cassette by a disk lifter similar to the lifter used in the prior art system illustrated in FIG. 1. In this case the lifter travels up through opening 222 and then through the cassette where it engages a substrate and then lifts the substrate through transfer zone 203 and into disk loading zone 205. A similar lifter is employed to transfer coated substrates back to the cassette 224 receiving substrate which when fully loaded exits transfer station 201. The lifter takes a substrate from the unload zone and moves down through the path on the unload side and then through the cassette where the substrate remains as the lifter arm moves on through opening 223.

A substrate that arrives in the load zone in initially in a position above the transfer zone 203. At that point a pick-up arm 210 moves outwardly and into the hole in the middle of the substrate. This arm 210 connects to the substrate by clips that are inserted into the center section of the substrate and there grasp the inner edges of the substrate center hole or opening. The arm 210 then moves back to the position shown in this Figure where it actuates a mechanism 211 which in turn opens the jaws of a disk carrier. The disk carrier jaws are then positioned around the disk or substrate, remove the disk from the pick-up arm, and grasp the disk to carry it through the various processes of the equipment.

FIG. 4C is a side view of this disk load/unload section shown in FIG. 4B. In this Figure a disk carrier 136 is shown in side view. In this view wheels 137 located in the transport drive section 212 are in view. The wheels are used to transport the disk carrier throughout the system. Disk carriers may be moved from process chamber to process chamber by a magnetic drive system 212 in part, located at the base of each chamber and in part, as a mating structure located on the base of each disk carrier 216. Each disk carrier and each chamber have independent transport elements for operation with the magnetic drive system 212. The wheels for this system are driven by an ordinary motor utilizing a rotary vacuum feed through but they may be replaced by a linear motor. The disk carriers are moved by way of a soft magnetic material, such as 400 series stainless steel mounted in the carrier base 216. Illustrated in the lower section of FIG. 4C is the side view of the cassette 202 in the lower chamber.

Also shown are the magnet actuating systems 211 that are energized to open the disk carrier 136 as to permit the insertion of a substrate 130 or to release a processed substrate in the unload zone 207. Four such magnets are shown. However fewer or more may be used to accomplish the purpose of opening and closing the jaws of the substrate holder.

Around the substrate is a halo structure 213. This structure is attached to the disk carrier 136 and permits the processing of substrates of different diameters. For example the halo structure can be widened or narrowed or even removed from the disk carrier as to permit the positioning of varying sized substrates in the holder for processing. The disk or substrate in position in the disk carrier is held at its edges by the halo structure 213 or if none is in use then by the disk carrier 136 itself.

Figure 5A:
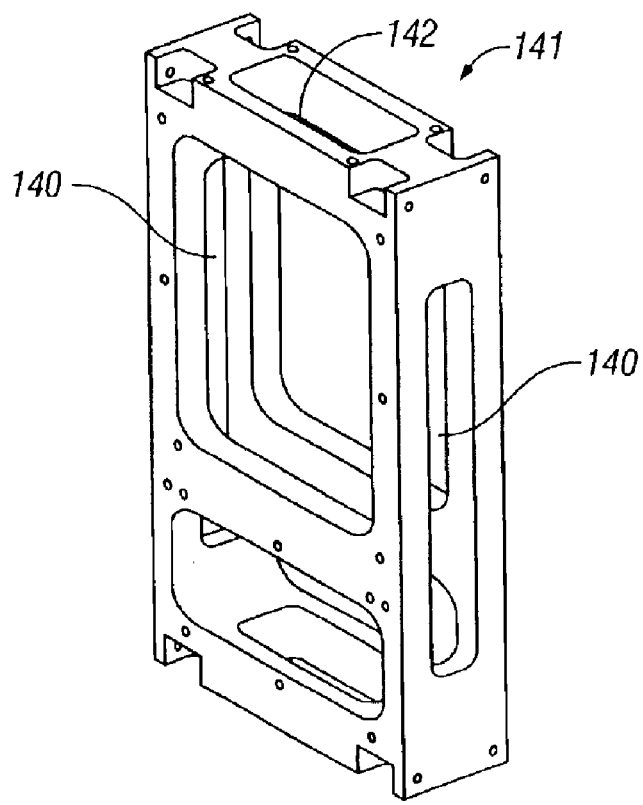
FIG. 5A is a schematic of the support structure of a process station and FIG. 5B is a horizontal section through the process station.

FIG. 5A shows the structure of a typical process chamber 135 in which processing operations are performed in system 125. The disk holder positions disks in the upper opening. The sides 140 when fully assembled include isolation seals to isolate the chamber from adjacent chambers and the rest of the system. A cold trap, vacuum pump or instrumentation may be placed at the top opening 142. The primary vacuum pump for a chamber is positioned adjacent to the chamber on the isolation valve body (shown in FIG. 5B) and pumping is through opening 140. In the preferred embodiment each chamber has its own cryo, turbo or other suitable pump to maintain uniform and controlled vacuum environments in each of the chambers. The front opening as well as the back opening are used for example in connection with a chamber doing sputter deposition, to position sources with targets on each side of the substrate being coated or processed. Other processing devices may also be positioned at these openings as to become chamber walls enclosing the processing chamber. At the openings at the base there are positioned the wheels and lower section of the disk carrier, a seal to close off openings and drive motors 163 for the transport.

Figure 5B:
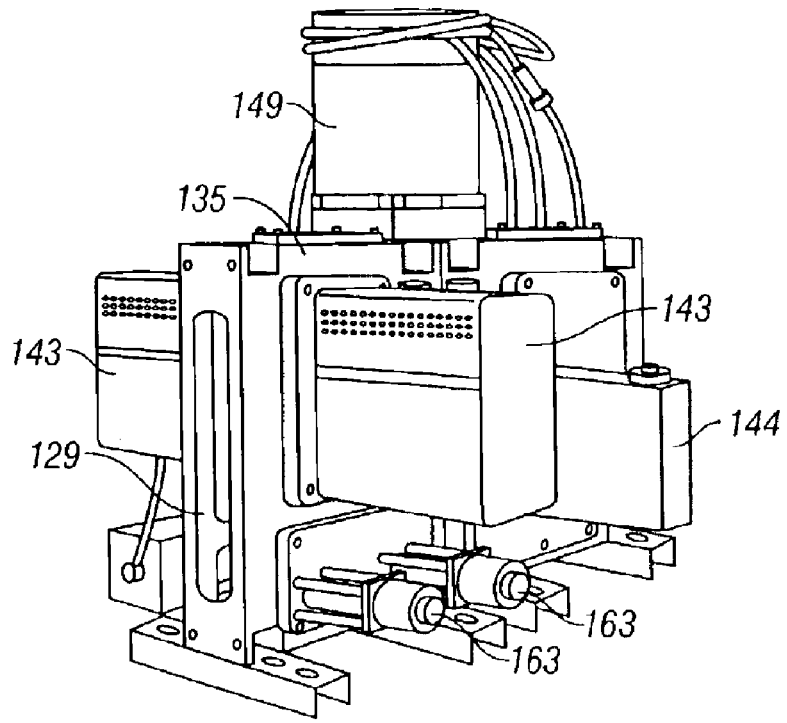

FIG. 5B illustrates a processing station showing elements in place. At the top is shown the turbo pump 149 with 2 sputtering sources 143 mounted on the chamber frame 135. Also seen in this figure is isolation valve 144 which seals this chamber on its right side. On the left side an opening 129 is shown to fit this chamber against other chambers or to an elevator. An adjacent chamber would normally have an isolation valve on the side fitted to this chamber so that the chambers are isolated from each other.

Figure 6A:
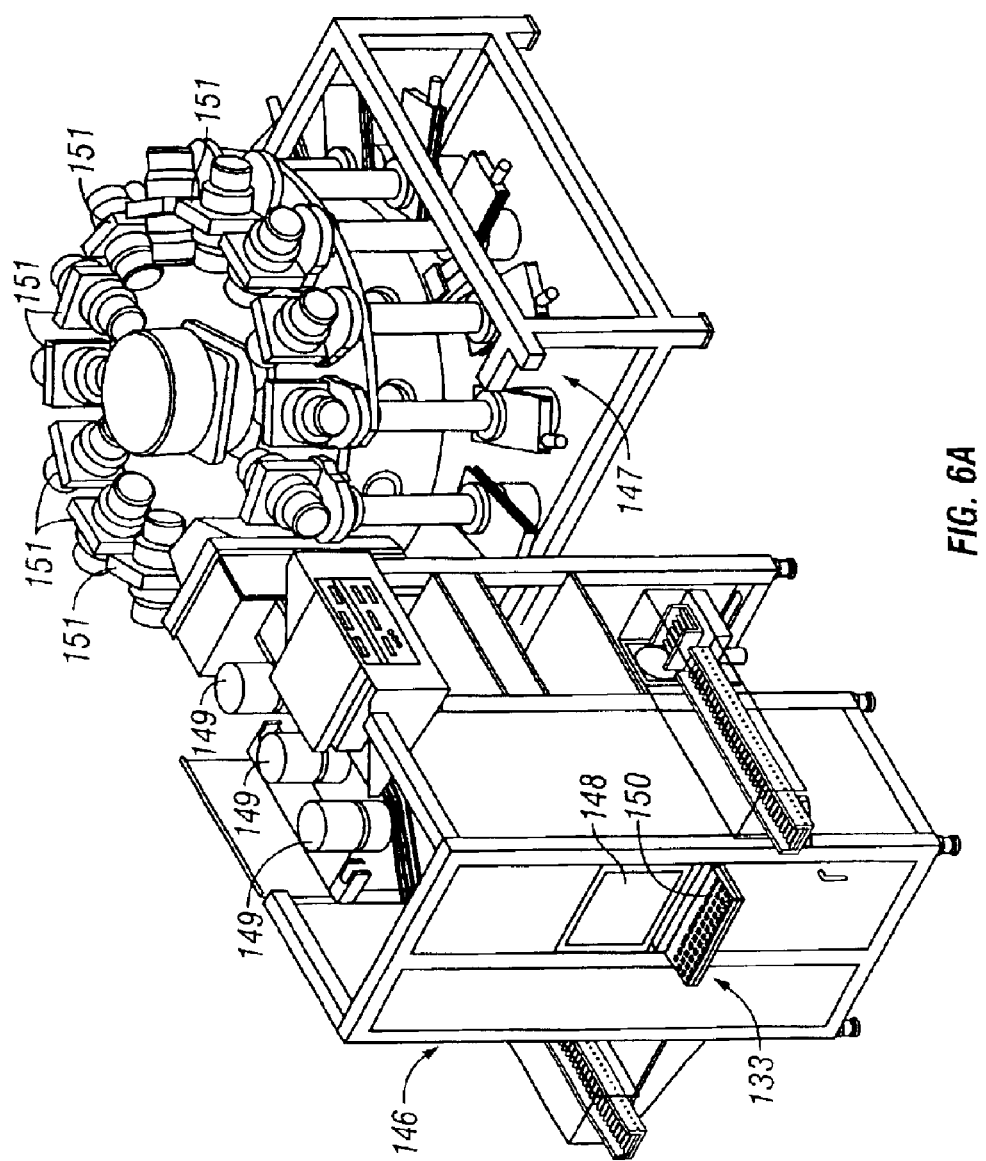
FIG. 6A is a schematic view of a system in which the novel multi-station small footprint system of this invention is combined with a circular system and FIG. 6B is a side view schematic of this same unit.
Figure 6B:
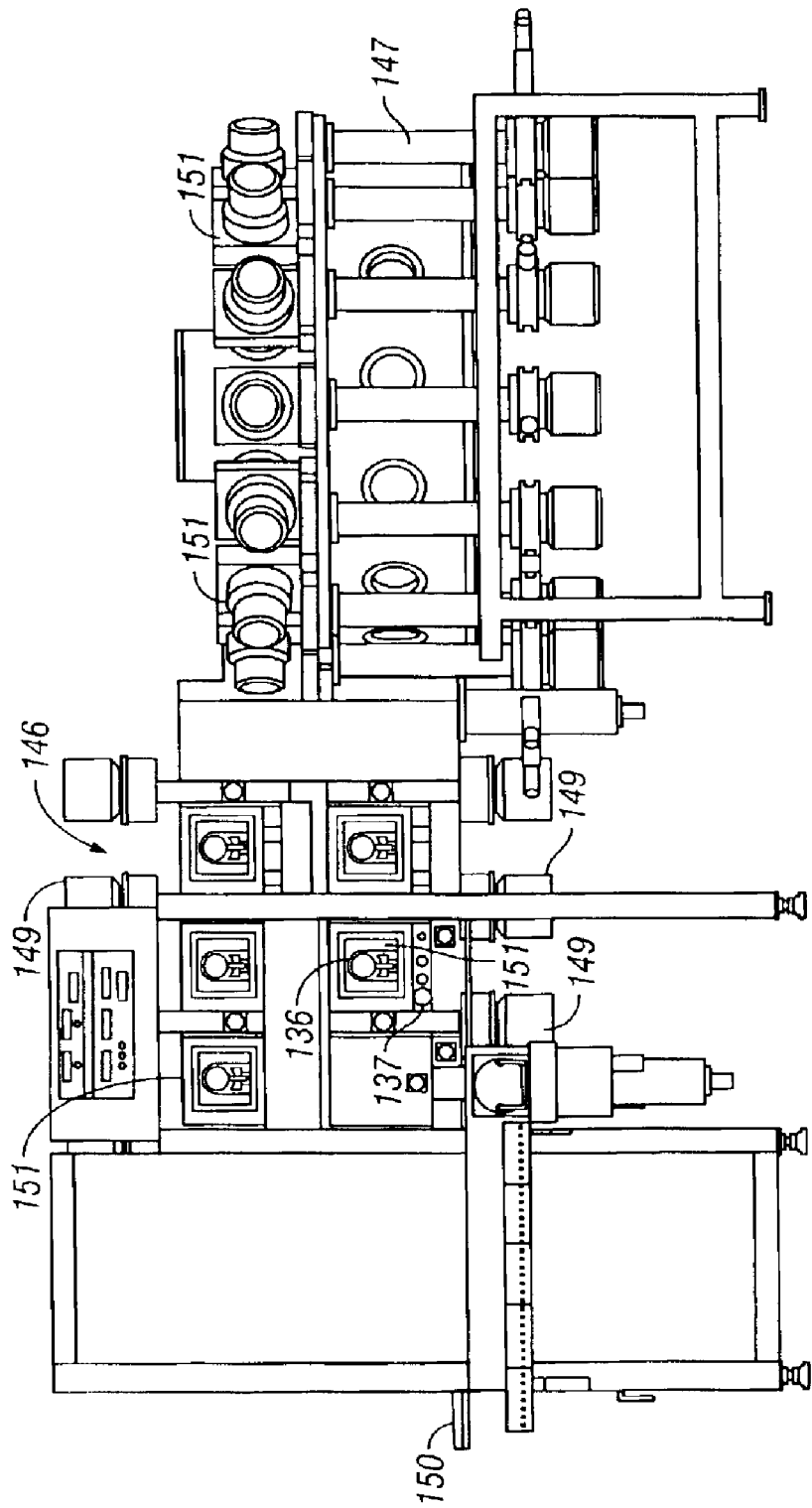

Referring now to FIG. 6A there is illustrated a stacked system 146 connected to a circular system 147. This combined unit may comprise a complete processing system or may illustrate the addition of more process capabilities to existing circular units by providing stacked process stations feeding to or from systems like those presently in use commercially in the art and illustrated in FIG. 1. In this unit, the circular portion 147, with process stations 151, is supported by rails 144, processes substrates sequentially by moving the substrates from chamber 151 to a next chamber. The first section of this unit 146 illustrates process stations in a line. These can be identified by the vacuum pumps 149 attached at the upper portion of the process chambers. Although three upper processing chambers are illustrated, it should be understood that a system may comprise more or less of such stations depending on the needs and/or the desires of the user. Also although not seen in FIG. 6A, this section 146 may include a lower layer of process stations beneath those appearing connected to vacuum pumps 149. This is shown in FIG. 6B. A vacuum pump exists for each process chamber. Similar vacuum pumps extend below the process chambers for process chambers at the lower portion of the stack at 146. Again this is seen in FIG. 6B. A screen 148 and keyboard 150 comprise operator station 133 to control operation of the equipment. The circular configuration 147 includes single processing chambers with vacuum pumps attached. If the stacked front end section 146 is attached to a system like that shown in FIG. 1, the substrate in the disk carrier of section 146 will transfer disks into the substrate handling system of FIG. 1 or to disk gripper 70 at loading station 42 to thereafter be fed into and through the system.

FIGS. 7A–E, is a set of diagrams illustrating how disks may be moved through the stacked system illustrated for example in FIG. 2. FIG. 7 comprises five different diagrams. Illustrated is how the arrangement of disks as they enter a process chamber and then how the disks are transferred between stations. The disks are numbered 1–5, and 18–25 for purposes of following movement from place to place in the diagrams. Thus in FIG. 7A, disk 1 is in position in the lower or entry section of elevator 128 and disk 2 is at the entry station. Substrates 3, 4 and 5 are awaiting entry into the equipment and would normally be positioned in a cassette awaiting transfer into the disk carrier. In FIG. 7B the elevator moves disk 1 to the top level into a position to enter into the processing chambers for processing and disk 18 exits and is separated from its disk carrier as is described in connection with FIGS. 4A–C. It is then loaded into an unload cassette. Disk 2 in this Figure is being loaded into a disk carrier in the load station again in accordance with the discussion in connection with FIGS. 4A–C. In FIG. 7C disk 1 is moved in a disk carrier into a first process station while disk 2 mounted into a disk carrier moves into the elevator and 18, a completed coated substrate is moved out of the system. Disk 3 is positioned for entry into the system and disk 19 is being readied to exit and is being separated from its disk carrier. The other disks shown in FIG. 7C are shown moved through the system. Thus at the top layer of processing stations, disks 25, 24 and 23 each move one station to the right (compared to positions occupied in FIG. 7B) and disk 1 moves into a processing station. The disk at the final position of the top layer at the right moves downwardly so that disk 22 now occupies the last position on the right of the lower layer while the other disks on the lower layer move one station each to the left. In FIG. 7D a new disk 4 is getting ready to enter the system while disk 20 is about to exit the system. Again the top layer of disks have all moved one station to the right and the end disk, disk 23 (FIG. 7C) moves down to the station below (FIG. 7D). In FIG. 7E disk 5 is shown entering the system, disk 4 mounted in a disk carrier is on the elevator and ready to move up to the entry station now occupied by disk 3. The disks move over and down following the route illustrated in the previous figures and disk 20 moves out of the system. At this point in the cycle for this structure and program, all the original disks 3, 4 and 5 that were awaiting entry into the system in FIG. 7A have entered and 3 new substrates 6, 7, and 8 are shown awaiting entry. Also at this point, disks 18, 19 and 20 have been completed and have been removed from the system. The system includes an elevator on both the left and right sides. On the left side the elevator moves disks to the top level of chambers for processing and on the right side the elevator lowers the disks for processing in the lower level and the disks return to the entry point along the lower process levels and then exit the system.

Figure 8A:
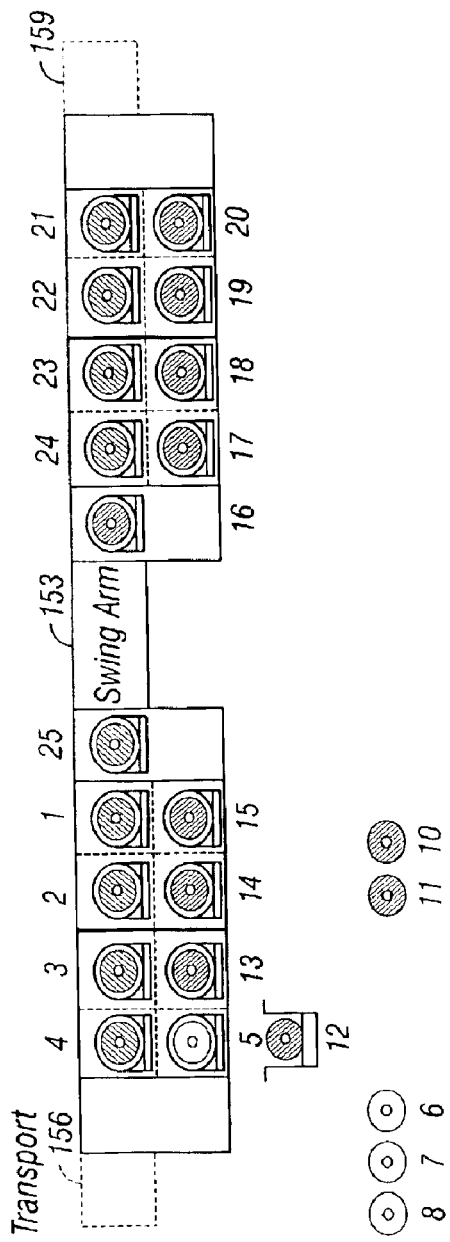
FIGS. 8A, B, C, D and E are illustrative disk transfer diagrams showing another programmed path that substrates and associated disk carriers travel in making magnetic coated substrates.
Figure 8B:
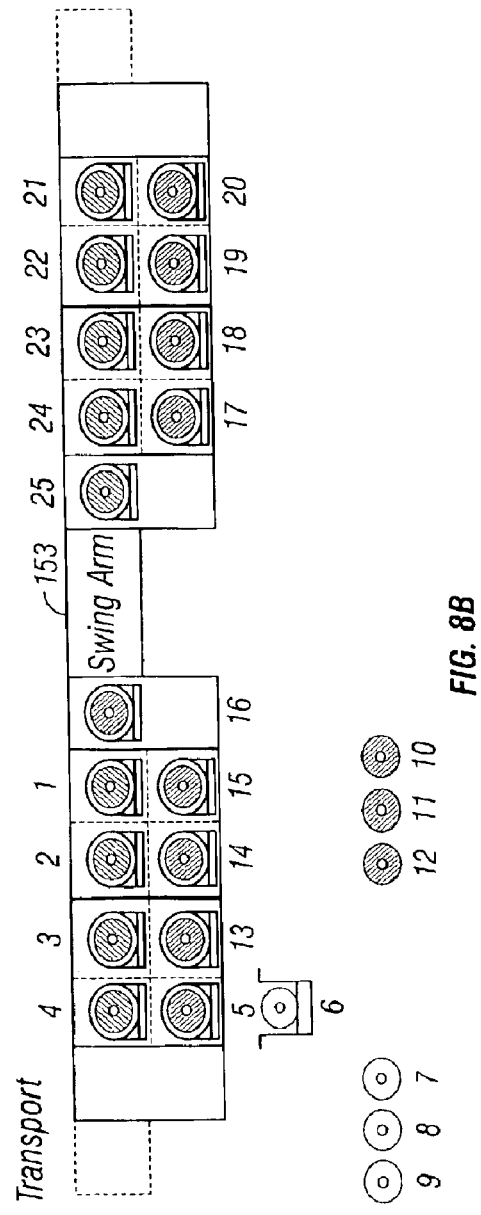
Figure 8C:
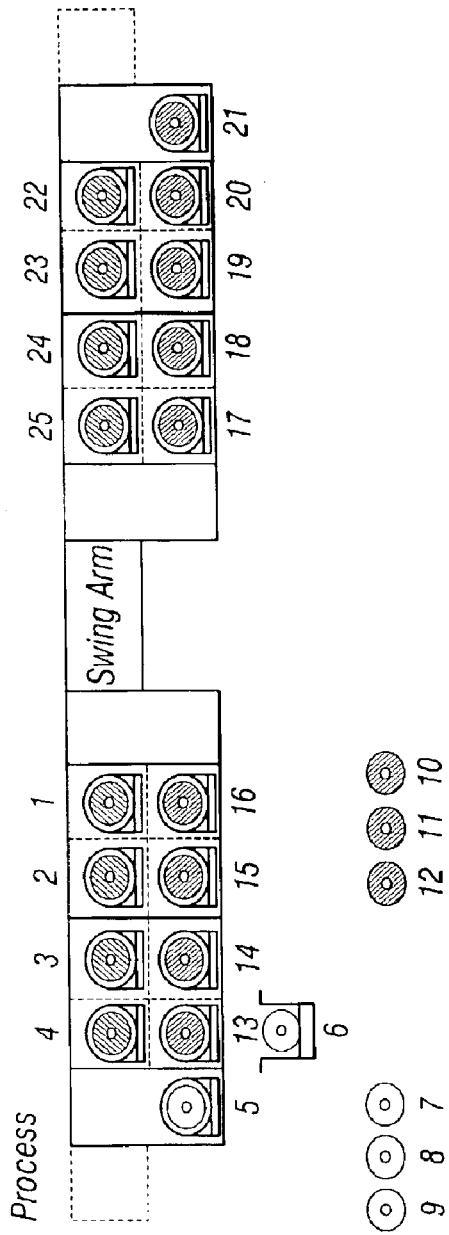
Figure 8D:
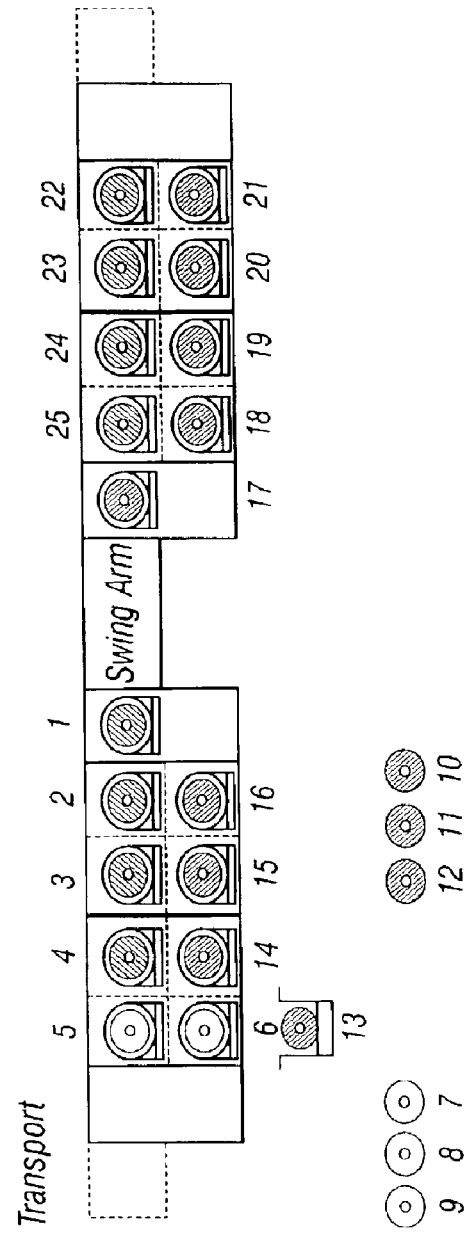

Referring now to FIGS. 8A–E, the equipment is shown in two parts with a swing arm to move substrates from one part to the other. Again the substrates have been numbered to simplify following their paths and travel. In FIG. 8A substrates 6, 7 and 8 are in position waiting to enter the system. Substrates 10 and 11 have been processed and have been moved out of the equipment. Substrate 12 joins the completed substrates in FIG. 8B and substrate 25 is moved by swing arm 153 from a group of stacked processing stations at the left to another at the right. In FIG. 8E substrates 6, 7 and 8 are in the system and are being processed while 12 and 13 have exited the system and joined the completed disks where they would be repositioned into the cassette holder. Also disks have moved from station to station as shown in FIGS. 8A–E.

Figure 9:
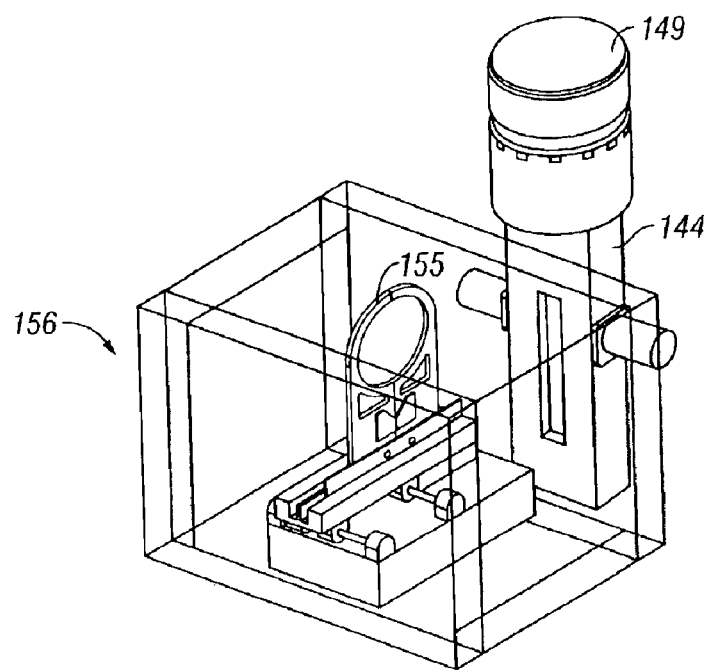
FIG. 9 is a schematic showing of a carrier exchange module.

In FIG. 9 there is shown a carrier exchange module 156. Carriers present during processing of substrates at various process stations become coated with materials being deposited at the process stations. For example, in a typical manufacturing process, to create magnetic hard disks, a substrate of aluminum may be initially coated using sputtering techniques with a chromium layer followed by the deposition of a cobalt alloy followed thereafter by the deposition of other layers as determined by the user in accordance with its process of manufacture, frequently proprietary, to manufacture magnetic disks. A final area of deposition may be based on creating a diamond like coating using, for example, a plasma enhanced chemical vapor deposition to deposit carbon, as for example is disclosed and discussed in U.S. Pat. No. 6,368,678 B1. Thus in a system in which chromium, cobalt and carbon are all deposited on the same substrate, there results a build-up of unwanted materials on the carrier if the same carrier is used in each of the processes. This in itself might not be a problem. However, a problem is created if the deposited materials on the carrier flake off during a subsequent process step so that the new deposition onto the partially coated substrate is disrupted or poisoned as to make the end product not dependable and/or not consistent with other produced output. To prevent this problem from arising, the system of this invention includes stations strategically positioned to permit the carrier to be changed to a fresh and clean carrier before further processing of the substrate takes place. FIG. 9 illustrates such an exchange module and FIGS. 10A–D illustrates a carrier exchange sequence. To start with a clean carrier 155 is loaded into the exchange module 156. The clean carrier may be loaded into this module by hand or alternatively by automatically feeding new carriers as programmed into the system to occur after a set number of uses of a carrier in process stations or a set number of exposures of carriers to particular process steps and/or depositions. A clean carrier in the carrier exchange module is first preconditioned so that impurities have been removed before they have had a deleterious effect on subsequent operations and on the coated substrate itself. The carrier exchange module may be placed at the end of the in-line structure, at either end or at both ends or in an equivalent position. For example it could be beyond the elevators as illustrated in FIG. 8A where the stations are identified as 156 and 159. A like station can also be placed at the point of the swing arm shown in FIGS. 8A–E, This structure permits the changing of disk carriers as the disk is moved from a first section to a second section of the process chambers so that when the disk enters the second section it can enter with a pre-cleaned disk carrier to effectively insulate the disk from the processes in the first section of the unit. Also when positioned as illustrated in FIG. 8A, a disk carrier may be transferred out of service by entering the module for cleaning following the transfer of a disk from the disk carrier. In FIG. 9 there is illustrated a vacuum pump 149 and an isolation valve 144. These enable the carrier exchange module 156 to connect directly into the system without causing corruption. Such a structure can be positioned as shown in FIG. 8A at 156 or 159 or may also be positioned to replace disk carriers at the point of the swing arm or at any other point where contamination will follow if the carrier is not changed. The system shown in FIG. 6A, if connecting to existing equipment, requires a hand off of the disk apart from the disk carrier when the disk moves from the in line equipment 146 where it travels in a disk carrier to the circular version 147 where the disk may be lifted from the disk carrier or from a cassette into which the disk is placed on entry into the circular portion 147 of the system. When the disk is positioned on a lifter it is then handed over to a carrier as used in the prior art, in the nature of a pedestal, that moves with the disk through the system until transferred back to a lifter to take the disk back to a cassette or to hand the disk over to a disk carrier for further processing in the in line part of the system 146. Thus a station 156 such as is shown in FIG. 9 can be provided at this point to separate the disk from the carrier as the disk completes its travels through section 146 and enters 147. Similarly, when the disk completes its travels through section 147 and is to reenter section 146, the disk can be reinstalled into a clean disk carrier at a station like that in FIG. 9.

In FIG. 10 a carrier exchange module is shown in a position beyond elevator 128. The system in FIG. 10 is programmed to skip load a carrier when the new carrier is ready. The new carrier 155 is used to replace the skip loaded carrier 157. This is illustrated by the empty carrier 157 in the initial chamber. The empty carrier follows a normal sequence of travelling upward in elevator 128. This is shown in FIG. 10B. In 10C there is illustrated the exchange of carriers. The clean carrier 155 replaces the carrier being exchanged 157 and as shown in FIG. 10D the clean carrier moves into the normal flow cycle and the new carrier requiring cleaning 157 is cleaned and then is inserted into the exchange module to be used to replace the next carrier requiring renewal.

Figure 11:
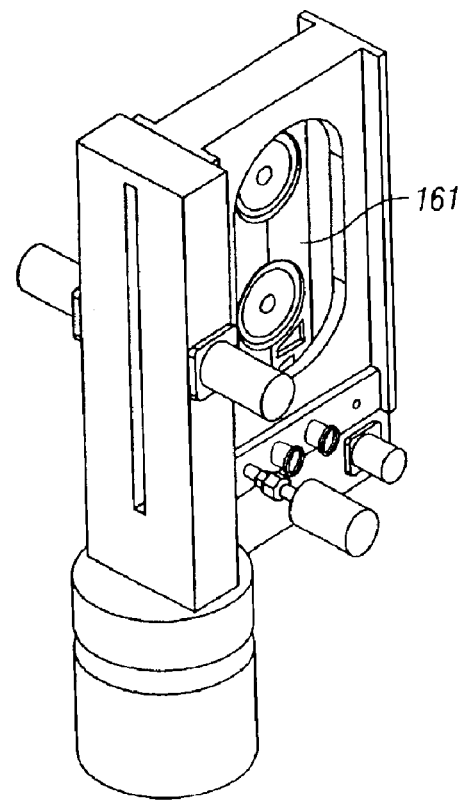
FIG. 11 is a schematic of a process station with a holder for two disks.
Figure 10A:
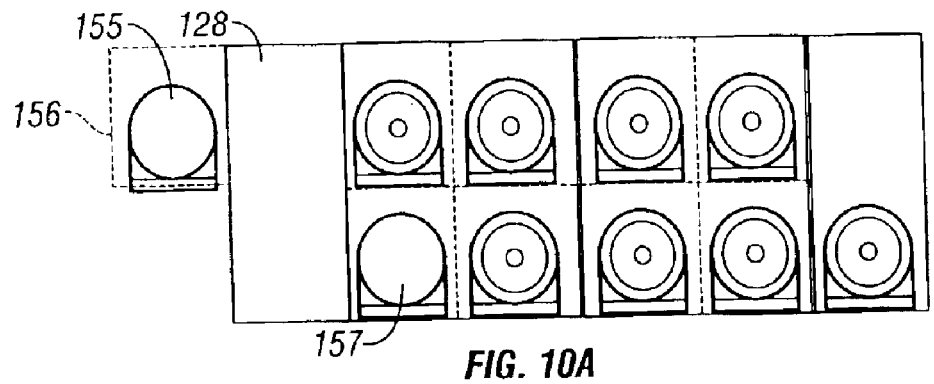
FIGS. 10A–D Illustrate a carrier exchange sequence.
Figure 10B:
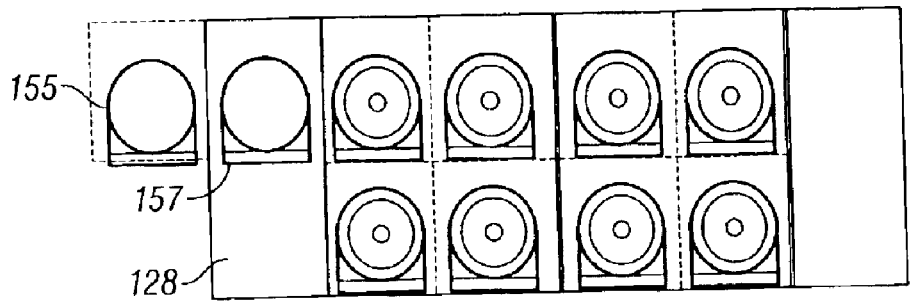
Figure 10C:
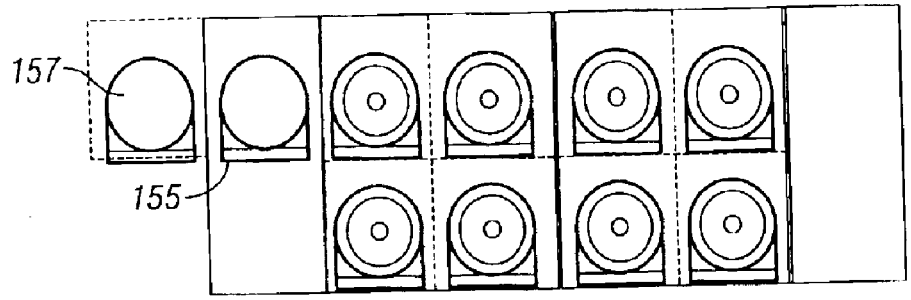
Figure 10D:
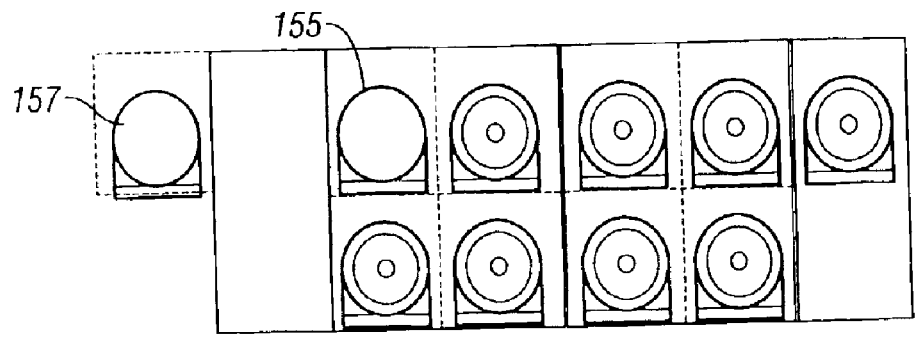

Referring now to FIG. 11, there is illustrated a disk carrier which holds two disks at the same time. This is achieved using a gripping mechanism 161 that holds two disks in position for processing in the various process chambers as the disk carrier moves through the system. This design can double the throughput of the system since the same time will be consumed in each process chamber whether there are two or one disk in the disk carrier.

Figure 12:
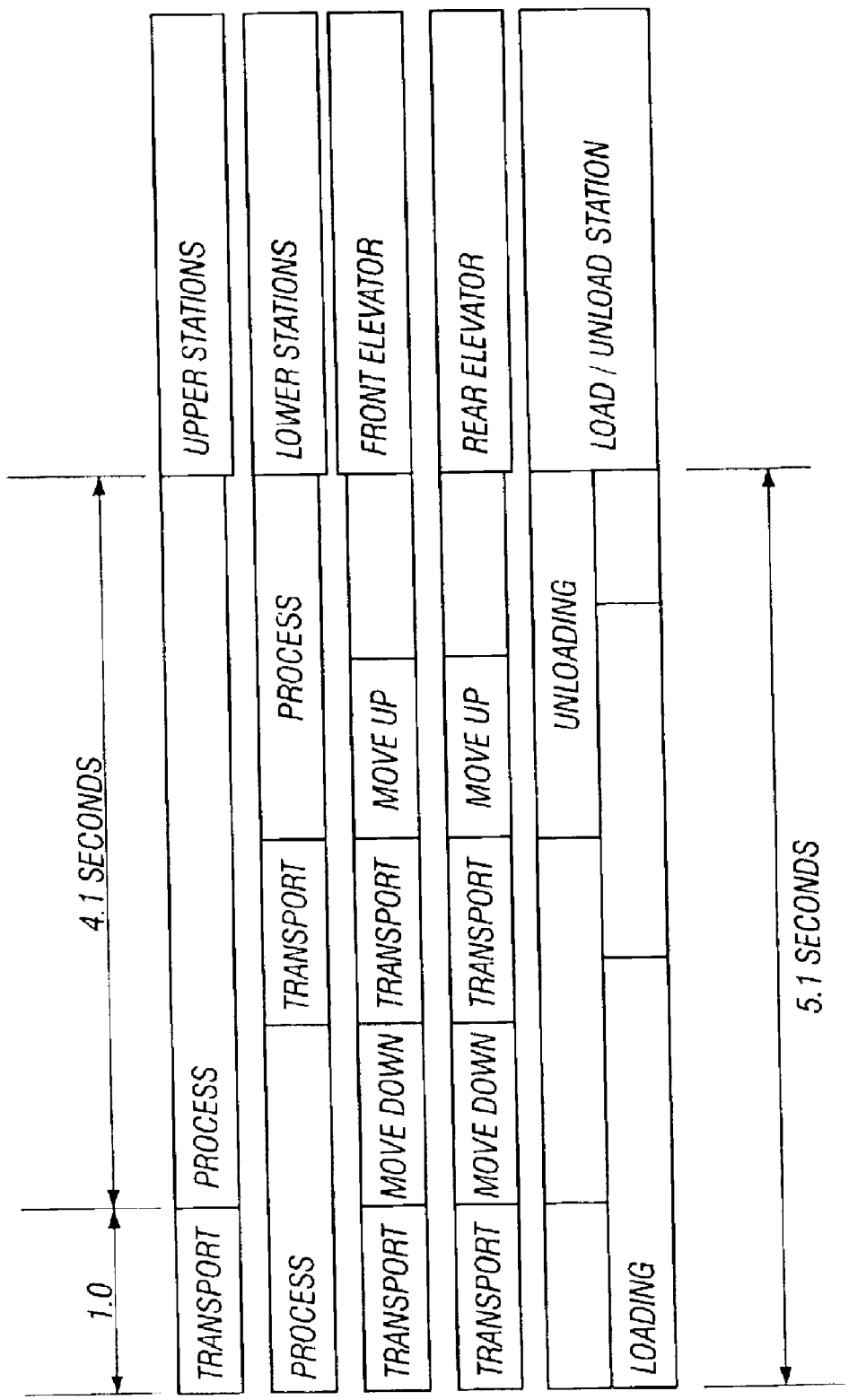
FIG. 12 is a chart showing a cycle of operation of the system.

FIG. 12 illustrates a cycle that is useable with the system 125 illustrated in FIG. 2. This cycle is based on 5.1 seconds per operation. One second is used for transport and 4.1 seconds are used for processing. These times can obviously be varied but system 125 is operable in accordance with these time constraints. Operating at these speeds results in the production of 700 coated substrates per hour and operating a normal eight hour day produces in excess of a million and a half disks per month.

Although processing in the process stations has not been discussed extensively, it should be understood that this equipment offers real advantages in this respect. For example a disk carrier may enter a process station and be continuously moved through a number of process stations during processing. This is known as pass by processing. This has an advantage for certain types of depositions. It is also possible to tie two or more processing stations together and process substrates for more time in the same processes. Thus instead, for example, of using 2 or more process stations to bring a substrate to temperature, two or more process stations can be combined into a single larger process station as to perform the desired function in a single station or the equivalent of a single station that normally requires considerable movement and multiple stations for the same results. Also, whereas the processing time usually used for a cycle is about 5 seconds, this can be either a very short period and too short a time for certain process operations or a long period for some process operations and thus the equipment can be programmed for varying operations. This can be dealt with in the equipment of this invention by combining process stations into a larger station as to allow the disk carrier to dwell longer in a station and permit processes that may require two or three time the amount of time required for other operations or it may be achieved by slowing down the cycle provided those operations requiring less time are properly adjusted.

Although a preferred embodiment of this invention has been described and illustrated, it should be understood by those skilled in the art that various changes and modifications may be made without departing from the scope of the invention as defined in the appended claims.

What is claimed is:

1. A substrate processing system for the processing of substrates into magnetic disks comprising:
    an entryway to feed substrates in cassettes into the processing system and into a vacuum environment;
    a lifter to raise substrates one by one from said cassettes;
    processing stations aligned adjacent with one another to process substrates individually while substrates are maintained in a vertical orientation;
    disk carriers to carry substrates into processing stations and to hold substrates in a vertical position as individual substrates are processed and move through said processing stations and from station to station;
    a transfer device to transfer substrates in position on said lifter into disk carriers;
    transport paths and drives to move disk carriers from processing station to processing station and to an unload zone, said unload zone having a lifter to remove processed disks from said disk carrier after disk processing and to remove the processed disks back to a cassette to be transported out of said system;
    said processing stations being positioned in a stacked relationship with at least a second layer of processing stations positioned above a first layer of processing stations so that the footprint for two process stations is substantially not greater than the footprint for one process station and less than the footprint of two process stations positioned one following the other lengthwise.

2. A substrate processing system for the manufacture of magnetic disks in accordance with claim 1 in which said second layer of processing stations is positioned on top of said first layer of processing stations and in which the processes practiced in said processing stations manufacture magnetic hard disks.

3. A substrate processing system for the manufacture of magneto optical disks in accordance with claim 1 in which said second layer of processing stations is positioned on top of said first layer of processing stations and in which the processes practiced in said processing stations manufacture magneto-optical disks.

4. A substrate processing system for the manufacture of magnetic disks in accordance with claim 1 including a disk carrier exchange station positioned along the path of travel through said processing stations by a disk carrier to furnish clean replacement disk carriers for a carrier that has been exposed to coating processes in said system.

5. A substrate processing system for the manufacture of magnetic disks in accordance with claim 1 in which the path of travel of a disk carrier is from processing station to adjacent processing station in sequence and from a first level to the second level following processing at said first level in an elevator.

6. A substrate processing system in accordance with claim 4 in which said disk carrier exchange station is positioned at the start of a process sequence at the initial level for processing and in which a clean disk carrier is substituted for a disk carrier that has completed cycles and otherwise would have accepted and sequenced a new incoming disk.

7. A substrate processing system in accordance with claim 4 in which said disk carrier exchange stations is positioned at a point in the process sequence following processing of disks with processes that result in deposits on the disk carrier that can poison later processes and in which a clean disk carrier can be substituted for a disk carrier with depositions on its surface.

8. A substrate processing system for the manufacture of magnetic disks in accordance with claim 5 in which the path of travel of a disk carrier is into an elevator to raise the disk carrier to the upper level and then from processing station to adjacent processing station in sequence on said upper level and from said upper level to the lower level following processing in said upper level in an lift.

9. A processing system in accordance with claim 1 in which said disk carriers each carry more than a single disk.

10. A combination processing system to manufacture magnetic hard disks comprising:
    a stacked set of processing stations to process substrates in a vertical position with coating materials used in manufacturing magnetic hard disks, said processing stations being positioned in a reasonably straight line with one layer of processing stations positioned on top of the other layer of processing stations so that a second station is generally directly above a first station;
    a circular set of processing stations to process substrates with coating materials used in manufacturing magnetic hard disks; and
    feeding equipment to transfer substrates processed in said straight line stacked set of processing stations to and through said circular set of processing stations and then sequentially back through the other level of stacked processing stations to a point to exit the system.

11. A combination processing system to manufacture magnetic hard disks in accordance with claim 10 in which the circular set of processing stations are at the circumference of a central vacuum system.

12. A substrate treatment system to manufacture magnetic hard disks comprising,
    a load station to feed cassettes of substrates for processing from atmospheric conditions into a vacuum environment through a vacuum load lock,
    an unload station to feed coated magnetic disks after processing into cassettes and out of a vacuum environment through a vacuum load lock to atmospheric conditions;
    a lifter blade to lift substrates individually from cassette at said load station and to transfer substrates to a first station where substrates are placed into a disk carrier;
    disk carriers to hold substrates in a vertical position and carry substrates to and through process stations;
    process stations to process said substrates in said disk carriers;
    a transport system to move disks in disk carriers from station to station at programmed intervals;
    said processing stations positioned in two levels, one above the other,
    at least one disk carrier lift to raise and/or lower disk carriers from one level to a second level; and
    said transport system configured to transport disk carriers laterally and vertically from processing station to processing station and to said unload station whereat the disk is moved into an unload cassette for transfer out of the vacuum environment to atmospheric conditions through an unload aperture by transferring said cassette through a vacuum load lock.

13. A substrate treatment system in accordance with claim 12 in which a disk carrier in a process station is continuously moved while being processed in said station.

14. A substrate treatment system in accordance with claim 12 in which one or more process stations are internally connected as to enable a disk on a disk carrier placed within any such station to be processed in accordance with the processes practiced within said stations for a period of time substantially equal to the time of processing within a single process station in the system times the number of connected process stations.

15. A substrate treatment system to manufacture magnetic hard disks comprising
- a slot to feed cassettes of substrates from atmospheric conditions into a load station and cassettes of coated magnetic disks from an unload position out of the system and into atmospheric conditions;
- a lifter blade to lift substrates out of a cassette in said load station and transfer substrates to a station where substrates are placed into disk carriers;
- disk carriers to hold substrates in a vertical position and carry substrates to and from processing stations;
- processing stations to process substrates on said disk carriers;
- a transport system to move disk carriers from station to station in sequence at programmed intervals;
- a disk carrier lift to raise disk carriers from a first level of processing stations to a second level of processing stations;
- said processing stations being positioned in two levels, one above the other, and said transport system transferring said disk carriers laterally from processing station to processing station and vertically in said disk carrier lift from one level to the other.

16. A processing system in accordance with claim 15 including a station to change disk carriers by substituting a clean carrier into the system for a carrier that has been used within the system while coatings were deposited onto disks moving on said carrier though said system.

17. A processing system in accordance with claim 16 in which the disk carrier is opened and a disk is then placed between jaws of the disk carrier and the jaws close upon the disk to grasp the disk in the disk carrier to carry the disk through processing stations.

18. A processing station in accordance with claim 17 in which the disk is moved from said lifter blade into said disk carrier with a transport mechanism that transfer the disk by holding the disk in its central opening.

19. A processing chamber for a disk manufacturing system fitted to be positioned on top of another disk processing chamber comprising a vacuum pump extending from said chamber to pump a vacuum in said chamber, an opening at one side of said chamber to be positioned attached to an adjacent chamber, an isolation valve on the other side of the chamber to isolate the chamber from other chambers during processing within said chamber, magnetic means at the base of said chamber to assist in the transport of a disk carrier into and out of said chamber process sources positioned on the front and back walls of said chamber to enable processing of both sides of a disk positioned within said chamber, and a similar chamber-positioned beneath said chamber with a vacuum pump extending therefrom to enable actively processing another disk in disk carrier in said lower chamber during processing or transport of a disk carrier in said upper disk processing chamber.

20. A method of manufacturing a magnetic hard disk comprising placing a substrate to be processed into a vacuum chamber, lifting said substrate to a load chamber and loading said substrate into a disk carrier at said load chamber, moving said substrate and disk carrier to at least a first processing chamber at a first level and processing said substrate in said processing chamber, moving said substrate and disk carrier into a lift, changing the elevation of said substrate end said disk carrier to a different level, moving said substrate and said disk into at least a processing chamber at said new level, moving said substrate and disk carrier into a station and separating said disk from said disk carrier, lowering said disk and removing said disk from the vacuum environment.

21. The method of claim 20 in which a clean disk carrier is substituted for a coated disk carrier to avoid contamination of the disk in processing stations located following the change in the path of travel of the disk.

22. A substrate processing system comprising
- an entry chamber for substrates to enter the processing system;
- an exit chamber for substrates to exit the processing system;
- a first set of processing stations extending horizontally, each station of said first set aligned with and adjacent to other processing stations of said first set for processing substrates;
- a second set of processing stations in a stacked relationship to said first set of processing stations so that the second set of processing stations is generally within the footprint of said first set of processing stations, said second set of processing stations for processing substrates;
- carriers to support substrates during travel and during processing as substrates travel between at least some of said processing stations and while substrates are processed within at least some of said processing stations, said substrates being maintained by said carriers in a vertical position;
- an elevator system to elevate and lower substrates from one level of processing stations to the other level; and
- transport means to transport substrates from said entry chamber through said processing stations and through said elevator system and out said exit chamber.

23. A substrate processing system in accordance with claim 22 in which said first set of processing stations is in two sections with a space between sections with a swing arm positioned in said space to transfer a substrate apart from a carrier from a processing station in the first of the two sections to a processing station in the second of said two sections.

24. A substrate processing system in accordance with claim 23 in which a substrate transferred by said swing arm to said processing station in the second of said two sections is positioned in a clean carrier in the processing station in the second of said two sections and is thereafter processed in the processing stations in said second of said two sections.

25. A substrate processing system in accordance with claim 22 in which each of said first set and second set of processing stations includes a separation between groups of processing stations and in which a swing arm provides a means of transferring substrates apart from a carrier across said separations.

26. A substrate processing system in accordance with claim 24 including transferring said substrate from a first carrier to a second carrier in connection with transfer of said substrate across said separation with said swing arm.

27. A substrate processing system in accordance with claim 22 including means to maintain processing stations under vacuum conditions.

28. A processing chamber for a disk manufacturing system fitted to be positioned in a stacked relationship with another disk processing chamber comprising a vacuum pump extending from said chamber to pump a vacuum in said chamber, an opening at one side of said chamber to be positioned attached to an adjacent chamber, an isolation valve on the other side of the chamber to isolate the chamber from other chambers during processing within said chamber, magnetic means at the base of said chamber to assist in the transport of a disk carrier into and out of said chamber, process sources positioned on the front and back walls of said chamber to enable processing of both sides of a disk positioned within said chamber, said chamber being adapted to be positioned in a stacked relationship with a similar chamber-having an independent vacuum pump extending therefrom to enable actively processing disks in disk carriers in each of said processing chambers when in position in a manufacturing system.

* * * * *

US006919001C1

(12) INTER PARTES REEXAMINATION CERTIFICATE (0164th)
United States Patent
Fairbairn et al.

(10) Number: US 6,919,001 C1
(45) Certificate Issued: Jun. 8, 2010

(54) DISK COATING SYSTEM

(75) Inventors: Kevin P. Fairbairn, Santa Clara County, CA (US); Terry Bluck, Santa Clara County, CA (US); Craig Marion, Alameda County, CA (US); Robert E. Weiss, San Francisco County, CA (US)

(73) Assignee: Intevac, Inc., Santa Clara, CA (US)

Reexamination Request:
No. 95/000,235, Feb. 27, 2007

Reexamination Certificate for:
Patent No.: 6,919,001
Issued: Jul. 19, 2005
Appl. No.: 10/361,308
Filed: Feb. 10, 2003

Related U.S. Application Data

(63) Continuation-in-part of application No. 09/562,039, filed on May 1, 2000, now Pat. No. 6,517,691.

(51) Int. Cl.
C23C 14/56 (2006.01)
C23C 16/458 (2006.01)
C23C 16/54 (2006.01)

(52) U.S. Cl. .............. 204/298.25; 204/192.2; 156/345.31; 156/345.32; 118/719; 414/217; 414/225.01; 414/226.02

(58) Field of Classification Search .............. None
See application file for complete search history.

(56) References Cited

U.S. PATENT DOCUMENTS

| | | | |
|---|---|---|---|
| 4,670,126 A | 6/1987 | Messer et al. | |
| 4,717,461 A | 1/1988 | Strahl et al. | |
| 4,822,756 A | 4/1989 | Hirayama | |
| 5,121,707 A | 6/1992 | Kanoo | |
| 5,170,714 A | 12/1992 | Katagiri | |
| 5,205,919 A | 4/1993 | Zejda | |
| 5,215,420 A | 6/1993 | Hughes et al. | |
| 5,275,709 A | 1/1994 | Anderle et al. | |
| 5,543,022 A * | 8/1996 | Nguyen et al. | 204/298.15 |
| 5,658,114 A | 8/1997 | Mahler | |
| 5,705,044 A | 1/1998 | Washburn | |
| 5,846,328 A | 12/1998 | Aruga et al. | |
| 6,083,566 A | 7/2000 | Whitesell | |
| 6,183,615 B1 | 2/2001 | Yasar et al. | |
| 6,238,161 B1 | 5/2001 | Kirkpatrick et al. | |
| 6,471,459 B2 | 10/2002 | Blonigan | |
| 6,561,343 B2 | 5/2003 | Miyauchi et al. | |
| 2006/0054495 A1 | 3/2006 | Rohrmann | |

FOREIGN PATENT DOCUMENTS

| | | |
|---|---|---|
| DE | 19832084 C1 | 4/2000 |
| JP | H01-316457 | 12/1989 |
| JP | 03-287370 | 12/1991 |
| JP | 04-019819 | 1/1992 |
| JP | 05-104049 | 4/1993 |
| JP | 08-115968 | 5/1996 |
| JP | 08-236795 | 9/1996 |
| JP | 09-289243 | 4/1997 |

(Continued)

OTHER PUBLICATIONS

Singulus Technologies, "Modulus: The Family of Multilayer Sputter Deposition Systems for All ReWritable Optical Disc Formats," Company Brochure, Oct. 2000.

Unaxis Data Storage, "Racetrack: Revolution by Revolution," Tracks Special Edition Business and Technical News, Jun. 2005.

*Primary Examiner*—Terrence R Till

(57) ABSTRACT

There is described a disk processing and manufacturing equipment in which the processing chambers are stacked on top of each other and in which the disks move through the system on disk carriers which are adjustable to take disks of varying sizes. The disks enter the system through a load zone and are then installed into disk carriers. They move in the carriers sequentially through processing chambers at one level and then move to the other level in a lift or elevator. At this other level, the disks again move sequentially through the system on that level and then exit at an unload zone.

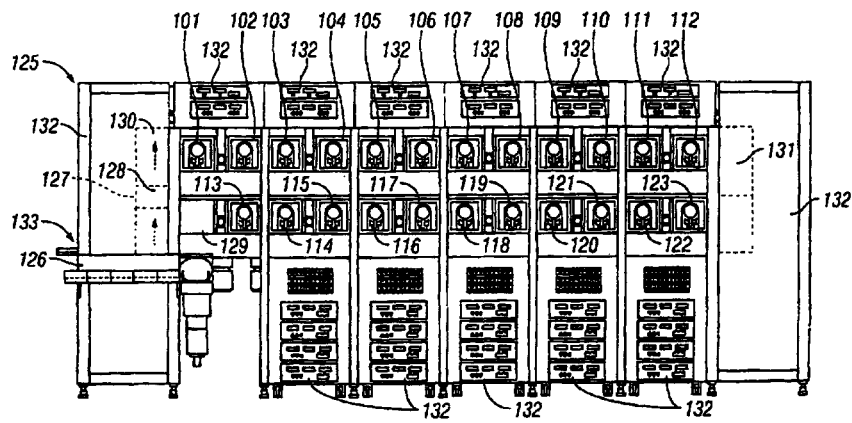

FOREIGN PATENT DOCUMENTS

| | | |
|---|---|---|
| JP | H10-209241 | 8/1998 |
| JP | 2000-015854 | 1/2000 |
| JP | 2000-167712 | 6/2000 |
| JP | 2001-166234 | 6/2001 |
| JP | 2002-523852 | 7/2002 |

* cited by examiner

INTER PARTES REEXAMINATION CERTIFICATE ISSUED UNDER 35 U.S.C. 316

THE PATENT IS HEREBY AMENDED AS INDICATED BELOW.

AS A RESULT OF REEXAMINATION, IT HAS BEEN DETERMINED THAT:

The patentability of claim, 1-18, 20, 21 and 23-26 is confirmed.

Claims 19, 22, 27 and 28 are cancelled.

\* \* \* \* \*